United States Patent
Sthalekar et al.

(10) Patent No.: US 10,992,308 B1
(45) Date of Patent: Apr. 27, 2021

(54) IN-SITU MEASUREMENT OF THE DELAY BETWEEN THE ENVELOPE AND THE RF SIGNAL IN ENVELOPE-TRACKING SYSTEMS

(71) Applicant: QUALCOMM Incorporated, San Diego, CA (US)

(72) Inventors: Chirag Sthalekar, Burlington, MA (US); Leon Metreaud, Pepperell, MA (US); Hakan Inanoglu, Acton, MA (US); Xiangdong Zhang, Westford, MA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/862,385

(22) Filed: Apr. 29, 2020

(51) Int. Cl.
*H03M 1/50* (2006.01)
*H03M 1/18* (2006.01)
*G04F 10/10* (2006.01)
*G04F 10/00* (2006.01)

(52) U.S. Cl.
CPC .......... *H03M 1/502* (2013.01); *G04F 10/005* (2013.01); *G04F 10/105* (2013.01); *H03M 1/18* (2013.01)

(58) Field of Classification Search
CPC ....... H03M 1/502; H03M 1/18; G04F 10/105; G04F 10/005
USPC .......................................... 341/157
See application file for complete search history.

(56) References Cited

U.S. PATENT DOCUMENTS

| | | | |
|---|---|---|---|
| 8,126,411 B2* | 2/2012 | Kim | H03F 1/0222 455/126 |
| 9,614,476 B2* | 4/2017 | Khlat | H03F 3/245 |
| 9,917,755 B1* | 3/2018 | Rullmann | H04L 5/0048 |

* cited by examiner

Primary Examiner — Brian K Young
(74) Attorney, Agent, or Firm — Haynes and Boone, LLP

(57) ABSTRACT

An in-situ delay measurement is performed for an envelope-tracking power amplifier of an RF input signal. Because the delay measurement is in-situ, the delay measurement avoids the necessity to down convert and digitize a version of an RF output signal from the envelope-tracking power amplifier.

26 Claims, 9 Drawing Sheets

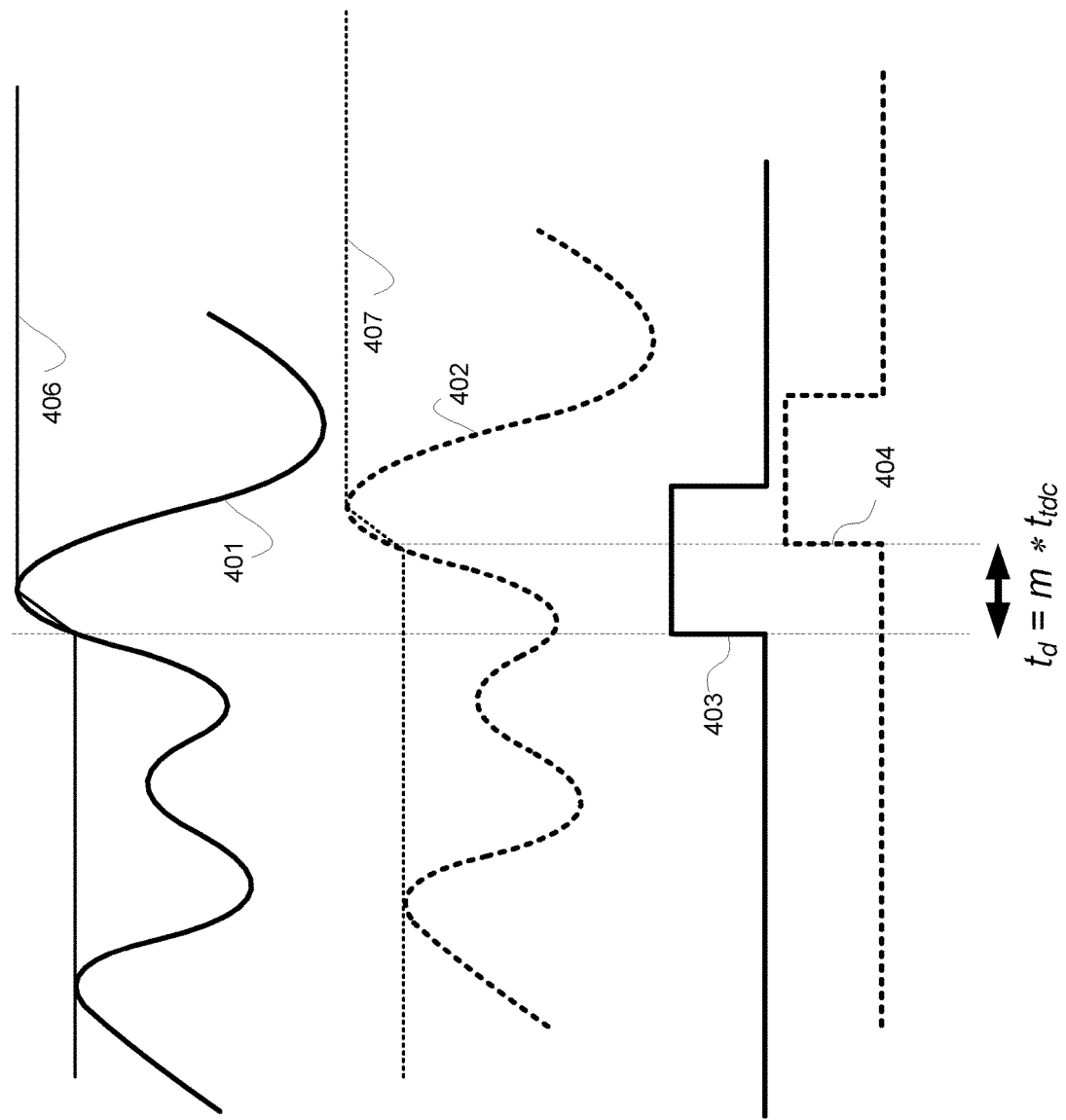

US 10,992,308 B1

IN-SITU MEASUREMENT OF THE DELAY BETWEEN THE ENVELOPE AND THE RF SIGNAL IN ENVELOPE-TRACKING SYSTEMS

TECHNICAL FIELD

This application relates to envelope tracking, and more particularly, to an in-situ measurement of the delay between the RF path and the envelope path for envelope-tracking systems.

BACKGROUND

The power consumption by a radio frequency (RF) power amplifier is a major factor for the battery life in devices such as cellular phones. An increase in the RF power amplifier efficiency thus has a major impact on the overall power consumption for such devices. To improve the RF power amplifier efficiency, it is conventional to use an envelope-tracking power supply to provide an envelope-tracking power supply voltage to the RF power amplifier. The envelope-tracking power supply voltage will thus have an amplitude variation that is generally synchronized with the envelope for the amplified RF output signal produced by the RF power amplifier. But due to processing delays and non-idealities, the amplitude variation for the envelope-tracking power supply voltage will tend to be delayed or out-of-synchronization with the envelope for the amplified RF signal. This mismatch leads to undesirable non-linearities and distortion.

SUMMARY

In accordance with a first aspect of the disclosure, a transmitter is provided that includes: a power amplifier configured to amplify an RF input signal to form an RF output signal; an envelope-tracking power supply configured to provide an envelope-tracking power supply voltage for the power amplifier; and a delay measurement circuit configured to measure a delay between an input envelope for the RF input signal and an output envelope for the RF output signal to provide a measured delay.

In accordance with a second aspect of the disclosure, a transmitter is provided that includes: a power amplifier configured to amplify an RF input signal to form an RF output signal; an envelope-tracking power supply configured to provide an envelope-tracking power supply voltage for the power amplifier; and a delay measurement circuit configured to measure a delay between an envelope for the RF input signal and the envelope-tracking power supply voltage to provide a measured delay.

In accordance with a third aspect of the disclosure, a method is provided that includes: converting a digital baseband signal into an RF input signal; amplifying the RF input signal through an envelope-tracking power amplifier to produce an RF output signal; detecting a peak in an envelope of the RF input signal and a peak in an envelope of the RF output signal; measuring a delay between the peak in the envelope of the RF input signal and the peak in the envelope of the RF output signal; and delaying the digital baseband signal responsive to the delay measurement.

In accordance with a fourth aspect of the disclosure, a method is provided that includes: converting a digital baseband signal into an RF input signal; generating an envelope-tracking power supply voltage responsive to a magnitude of the digital baseband signal; amplifying the RF input signal through a power amplifier to produce an RF output signal while the power amplifier is powered by the envelope-tracking power supply voltage; detecting a peak in an input envelope for the RF input signal and a peak in the envelope-tracking power supply voltage; measuring a delay between the peak in the input envelope and the peak in the envelope-tracking power supply voltage; and delaying the digital baseband signal responsive to the delay measurement.

These and other advantageous features may be better appreciated through the following detailed description.

BRIEF DESCRIPTION OF THE DRAWINGS

FIG. 4C is a timing diagram for an input envelope, an output envelope, a start pulse signal, and a stop pulse signal for the in-situ delay measurement circuit in accordance with an aspect of the disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
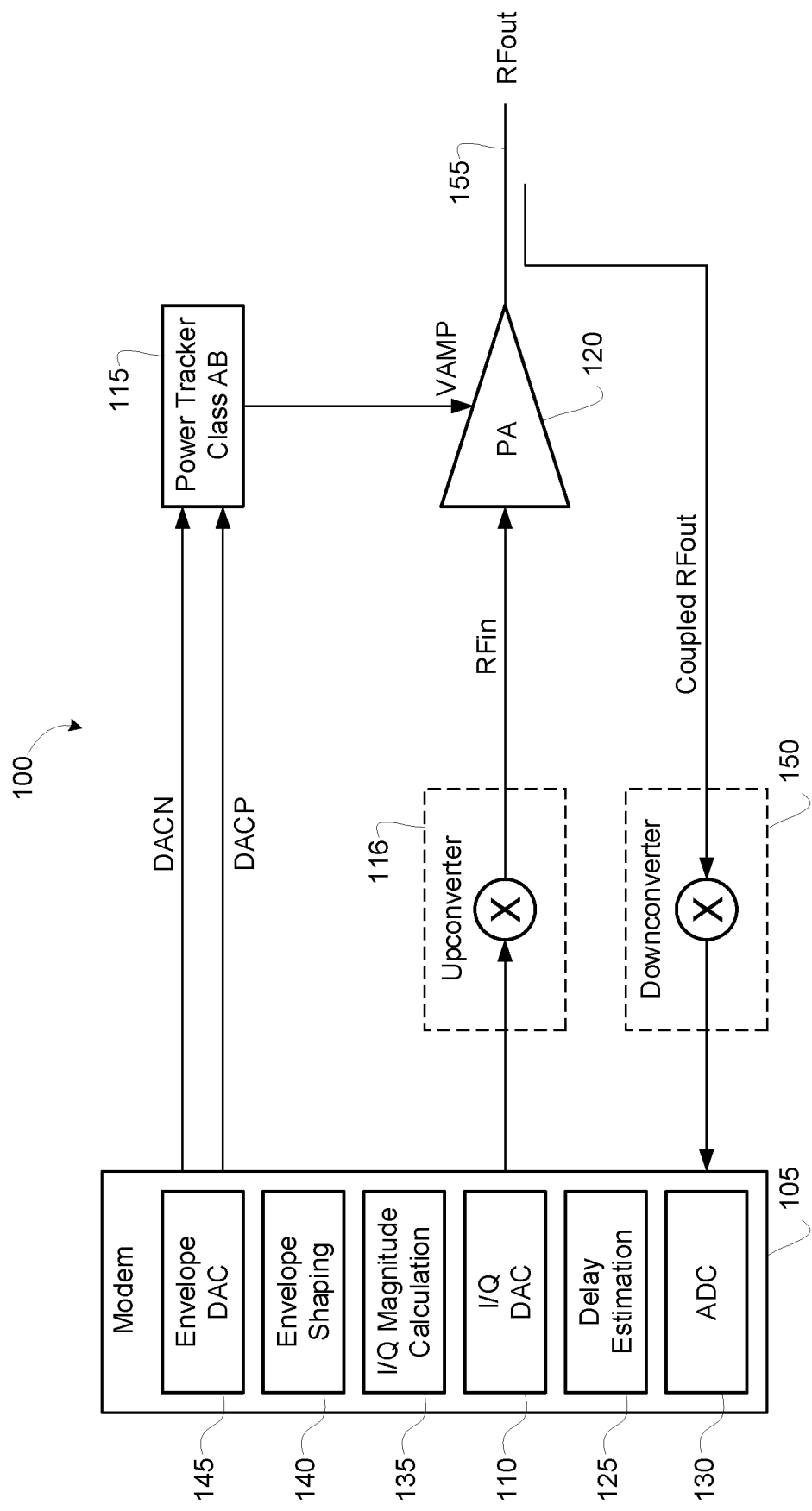
FIG. 1 illustrates a conventional transmitter in which the RF-path-to-envelope-path delay measurement is performed in the modem.

It is conventional for the delay estimation between the RF path and the envelope path in an envelope-tracking transmitter system to be performed in the baseband domain with the modem. An example conventional envelope-tracking transmitter 100 is shown in FIG. 1. A modem 105 includes an I/Q digital-to-analog converter (DAC) 110 to convert an in-phase (I) digital baseband signal and a quadrature-phase digital baseband signal into an analog baseband signal that is up-converted to RF in an up-converter 116. The up-conversion in up-converter 116 transforms the analog baseband signal into an RF input signal (RFin) for a power amplifier (PA) 120. Power amplifier 120 amplifies the RF input signal into an RF output signal (RFout).

To increase efficiency, an envelope-tracking power supply 115 generates an envelope-tracking power supply voltage VAMP that has an amplitude that varies according to an envelope for the RF output signal for power amplifier 120. Since modem 105 is generating the digital baseband I and Q signals, modem 105 can readily calculate a resulting signal magnitude of the digital baseband I and Q signals as represented by a I/Q magnitude calculation 135. Modem 105 then shapes the magnitude using an envelope shaping function or mapping function 140 to form a digital envelope signal that is converted by an envelope DAC 145 into a differential analog envelope output signal DACP and DACN. It will be appreciated that a single-ended DAC envelope output signal may be used in alternative implementations. Envelope-tracking power supply 115 adapts the amplitude of the power supply voltage VAMP responsive to the differential analog envelope output signals DACP and DACN so that the amplitude of the power supply voltage VAMP is adjusted responsive to the RF envelope.

The signal path through I/Q magnitude calculation 135, envelope shaping 140, envelope DAC 145, and envelope-tracking power supply 115 to produce the envelope-tracking power supply voltage VAMP may be deemed to constitute an envelope path. Similarly, the path through I/Q DAC 110, upconverter 116, and power amplifier 120 may be deemed to constitute an RF path. A propagation delay through the envelope path is inherently longer as compared to a propagation delay through the RF path. Without any mitigation of this delay difference, the resulting amplitude adjustment of the envelope-tracking power supply voltage VAMP is out of phase with the envelope for the amplified RF output signal. This lack of synchronization exacerbates the adjacent channel leakage ratio (ACLR) and other performance metrics for transmitter 100. It is thus conventional that modem 105 measures the delay between the envelope path and the RF path.

To measure the delay, the RF output signal is fed back such as from a coupler 155 to form a coupled RF output signal (CoupledRFout) that is down-converted to baseband by a downconverter 150 to form an analog feedback baseband signal. An analog-to-digital converter (ADC) 130 in modem 105 converts the analog feedback baseband signal into an envelope feedback signal. Modem 105 then determines the envelope-path-to-the-RF-path delay by performing a delay estimation 125 between the magnitude of the digital baseband signals and the envelope feedback signal. Modem 105 can then delay the I/Q digital baseband signal (or delay the analog baseband signal) responsive to the measured delay. With the proper delay, the envelope of the RF output signal and the amplitude variation of the power supply voltage VAMP are synchronized.

Figure 2:
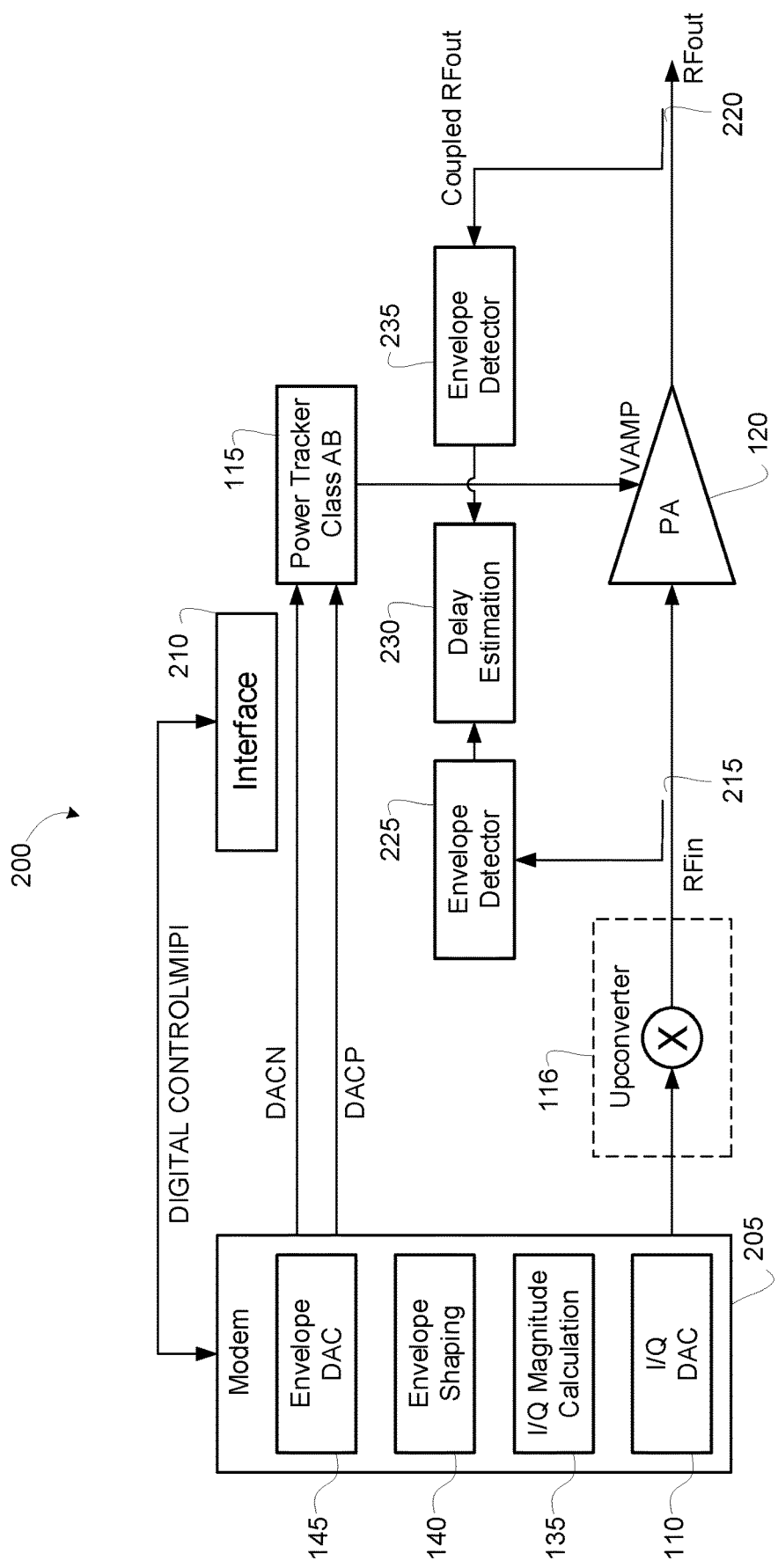
FIG. 2 illustrates a transmitter in which the RF-path-to-envelope-path delay measurement is performed in-situ between the RF output signal and the RF input signal to the power amplifier in accordance with an aspect of the disclosure.

Although modem 110 can accurately measure the delay between the RF path and the envelope path, note that the use of downconverter 150 and ADC 130 adds cost and complexity to the delay measurement. To avoid this complexity and cost, a delay measurement circuit is disclosed that does not use a down-converted version of the RF output signal. Since the delay measurement or estimation is not performed in modem 105, the resulting delay measurement is also denoted herein as an in-situ delay measurement. An example transmitter 200 is shown in FIG. 2 with an in-situ delay measurement circuit 230. A modem 205 includes an I/Q DAC 110 as well as an envelope DAC 145 producing the differential envelope signals DACP and DACN. Modem 205 is configured to perform the I/Q magnitude calculation 135 and envelope shaping 140 as discussed with regard to modem 105. Upconverter 116 also functions as discussed previously to upconvert the analog baseband signal from I/Q DAC 110 in transmitter 200 into the RF input signal (RFin) to power amplifier 120. It will be appreciated that other signal formats besides an in-phase (I) component and a quadrature-phase (Q) component may be used in transmitter 100 for the digital baseband signal. As also discussed previously, power amplifier 120 amplifies the RF input signal to form the RF output signal (RFout).

An envelope path delay in transmitter 200 is also analogous to the same envelope path delay in transmitter 100. A number of factors contribute to the RF-path-to-envelope-path delay including the processing delay in envelope-tracking power supply 115 and also the routing differences (e.g., printed circuit board routing differences) between the RF path and the envelope path. To measure this delay, in-situ delay measurement circuit 230 may instead measure the delay between the RF output signal and the RF input signal. That this delay between the RF output signal and the RF input signal functions as a proxy for the RF-path-to-envelope-path delay flows from the following properties. In particular, for periods in which the RF input signal has a relatively-large amplitude so that power amplifier 120 functions in compression, the output power for the RF output signal is a function of the envelope-tracking power supply voltage VAMP from the envelope path. The dominant amplitude contribution to the RF output signal during such periods will thus be from the envelope path. The measurement of the delay between peaks in the RF input signal and corresponding peaks in the RF output signal may thus be used to estimate the RF-path-to-envelope-path delay for transmitter 200.

To measure the RF-path-to-envelope-path delay, delay measurement circuit 230 receives an RF input envelope signal from an input envelope detector 225 that receives a coupled version of the RF input signal from a coupler 215. Similarly, delay measurement circuit 230 receives an RF output envelope signal from an output envelope detector 235 that receives a coupled version of the RF output signal from a coupler 220. An interface 210 may then communicate the measured delay to modem 205. Interface 210 may be a digital interface such as specified by the MIPI protocol although any suitable digital interface may be used in alternative implementations. Based upon the received delay, modem 205 may then delay the digital baseband I and Q signals accordingly. Alternatively, modem 205 may delay the analog baseband signal responsive to the measured delay. The RF-path-to-envelope-path delay is thus mitigated by modem 205. This advantageous mitigation is achieved without the use of a downconverter and a corresponding ADC to provide envelope feedback to modem 205. Since modem 205 does not calculate the delay, the in-situ delay measurement reduces power consumption, complexity, and cost of implementation.

Figure 3:
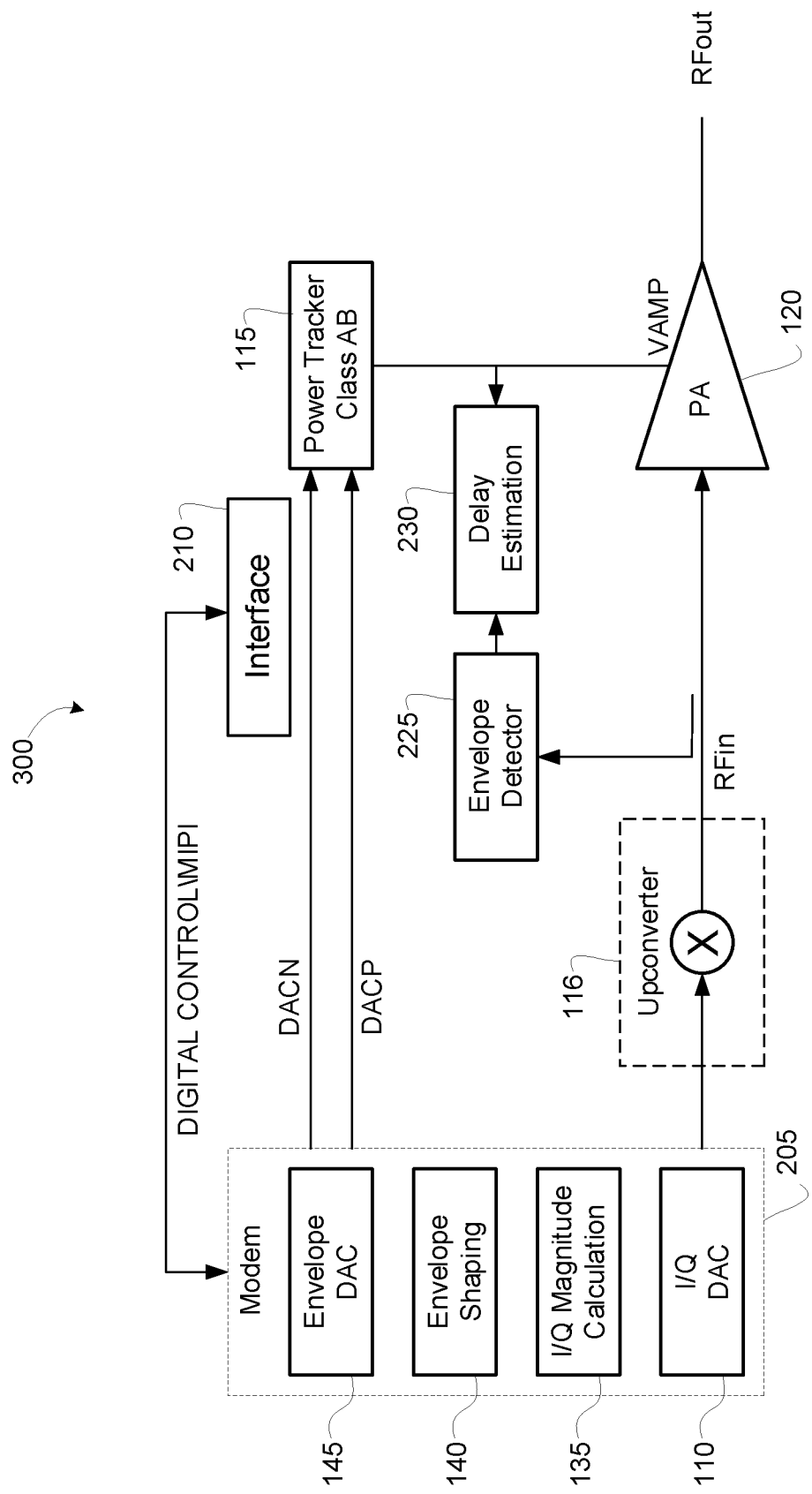
FIG. 3 illustrates a transmitter in which the RF-path-to-envelope-path delay measurement is performed in-situ between the envelope-tracking power supply voltage and the RF input signal to the power amplifier in accordance with an aspect of the disclosure.

In an alternative implementation, delay measurement circuit 230 may instead measure the delay between an envelope for the RF input signal and the envelope-tracking power supply voltage VAMP as shown in FIG. 3 for a transmitter 300. The remaining components for transmitter 300 are arranged as discussed for transmitter 200. Thus, a modem 205 for transmitter 300 includes an I/Q DAC 110, an envelope DAC 145, and is configured to perform the I/Q magnitude calculation 135 and envelope shaping 140 as discussed with regard to modem 105. Upconverter 116 also functions in transmitter 300 as discussed previously to upconvert the analog baseband signal from I/Q DAC 110 into the RF input signal (RFin) to power amplifier 120. Similarly, power amplifier 120 amplifies the RF input signal to form the RF output signal (RFout) as also discussed previously. Note that the there is no need to detect an envelope for the envelope-tracking power supply voltage VAMP as it is not an RF signal. Envelope detector 225 functions as discussed with regard to transmitter 200 to detect the envelope of the RF input signal. Interface 210 also functions as discussed for transmitter 200.

Figure 4A:
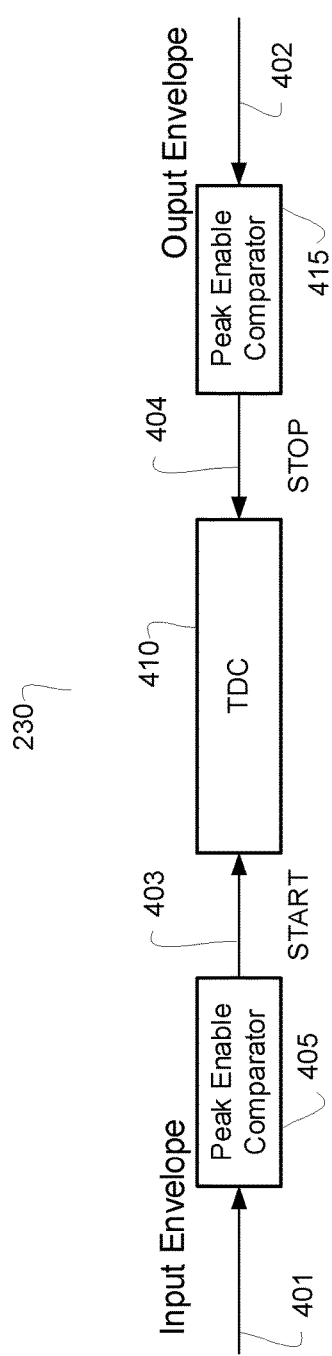
FIG. 4A illustrates an in-situ delay measurement circuit in accordance with an aspect of the disclosure.
Figure 4B:
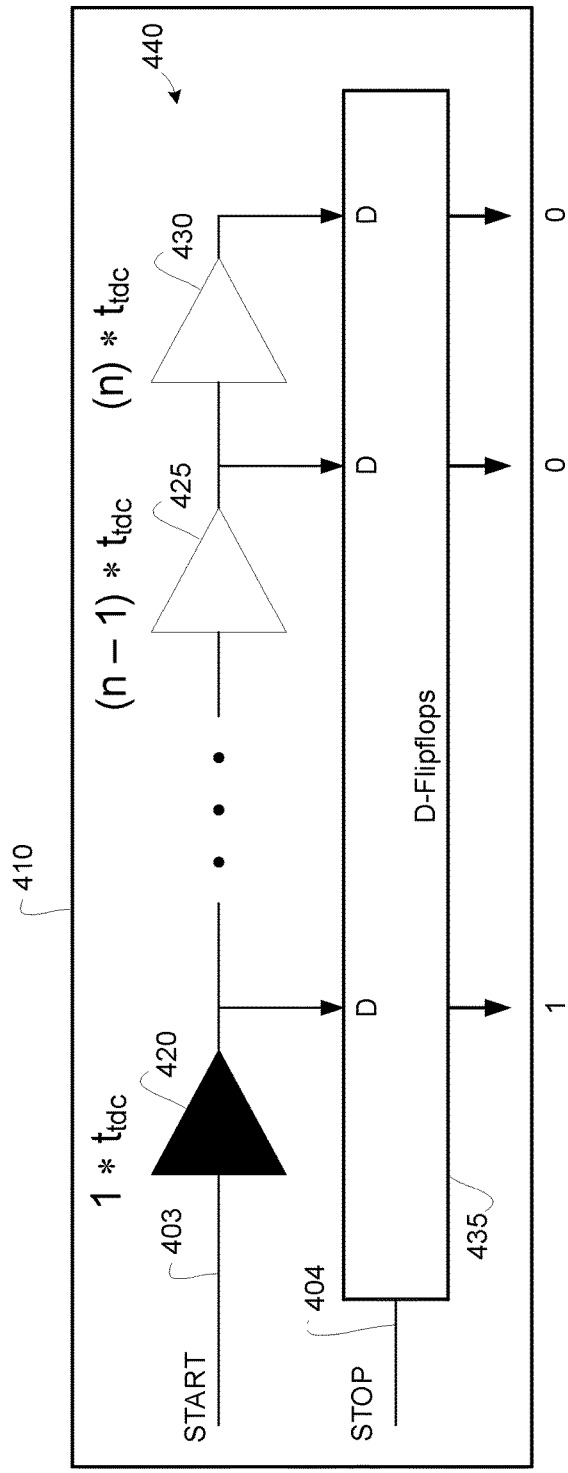
FIG. 4B is a circuit diagram for a time-to-digital converter for an in-situ delay measurement circuit in accordance with an aspect of the disclosure.

Delay measurement circuit 230 is shown in more detail in FIG. 4A. A first peak enable comparator 405 asserts a start pulse signal 403 responsive to a peak in an input envelope from envelope detector 225 (FIG. 2 and FIG. 3). Start pulse signal 403 triggers a time-to-digital converter (TDC) 410 to begin timing. As shown in FIG. 4B, TDC 410 may include a time-to-digital delay line 440 formed by a plurality n of delay elements beginning with an initial delay element 420. The delay line 440 continues through its various delay elements to an (n−1)th delay element 425 and ends with a final nth delay element 430. Start pulse signal 403 is successively delayed through delay line 440 while a stop pulse signal 404 is not asserted. Referring again to FIG. 4A, a second peak enable comparator 415 asserts stop pulse signal 404 responsive to a detection of a peak in an output envelope 402. In transmitter 200, the output envelope 402 is provided by envelope detector 235 whereas it is the envelope-tracking power supply voltage VAMP that forms the output envelope 402 in transmitter 300.

Each delay element in the delay line 440 is associated with a storage element (e.g., a D flip-flop in a plurality of n flip-flops 435). When start pulse signal 403 propagates through a delay element in delay line 440, the delay element triggers its corresponding flip-flop to store a binary one signal. Initially, all the flip-flops are initialized to each store a binary zero value. As shown in FIG. 4B, it is only initial delay element 420 that has triggered the data (D) input of its corresponding flip-flop to store a binary one value. But as start pulse signal 403 continues to propagate through delay line 440, additional ones of the flip-flops will also be triggered to store a binary one value (note that the binary value of whether a flip-flop has been triggered may be reversed in alternative implementations). Stop pulse signal 404 triggers all the flip-flops to latch their D input from their respective delay elements. The number of flip-flops that are triggered to store a binary one value depends upon the delay difference between input envelope 401 and output envelope 402. Each delay element delays the propagation of start pulse signal 403 by a TDC time increment ($t_{tdc}$). Since there are a plurality of n delay elements in delay line 440 (n being a plural positive integer), TDC 410 can time a delay of up to $n*t_{tdc}$.

Some example waveforms for input envelope 401 and output envelope 402 are shown in FIG. 4C. A peak value waveform 406 for input envelope 401 is adjusted when a new peak is reached at a rising edge of start pulse signal 403. Similarly, a peak value waveform 407 for output envelope 402 is adjusted when a new peak is reached at a rising edge of stop pulse signal 404. In this example, the rising edge of start pulse signal 403 is separated from the rising edge of stop pulse signal 404 by m TDC time increments $t_{tdc}$, where m is an integer less than or equal to n. The first m flip-flops in TDC 410 would thus store a binary one value in such an example whereas a remainder of the flip-flops would still store a binary zero. The outputs from flip-flops 435 may thus be considered to form an n-bit wide digital word that represents the delay between input envelope 401 and output envelope 402. Designing the delay elements in delay line 440 so that the TDC time increment $t_{tdc}$ provides less than a nano-second of resolution is readily achieved in modern CMOS processes.

Figure 5:
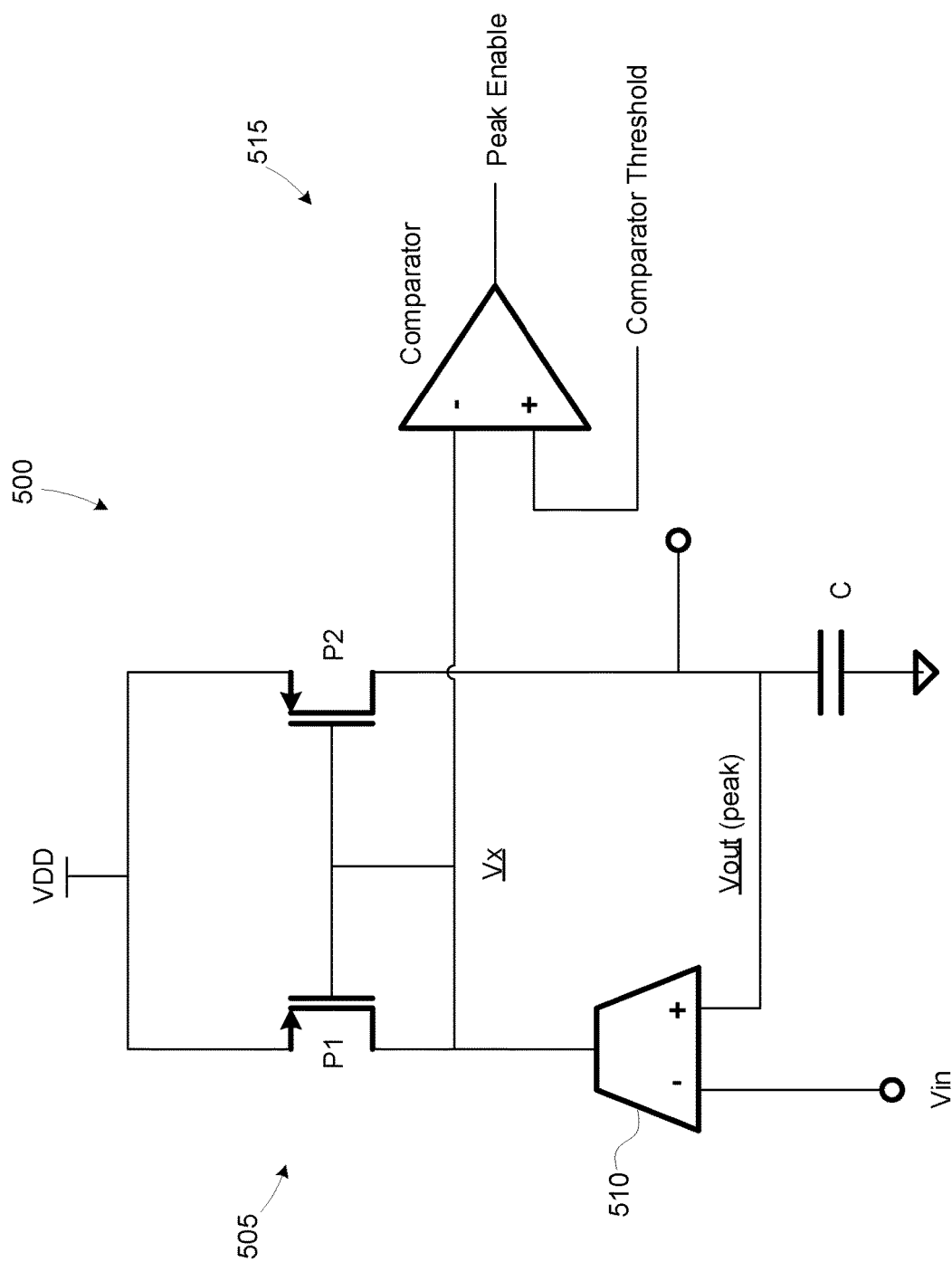
FIG. 5 is a circuit diagram for a peak detector circuit and a peak comparator for an in-situ delay measurement circuit in accordance with an aspect of the disclosure.

An example peak enable comparator circuit 500 is shown in FIG. 5 that may be incorporated into a delay measurement circuit. For example, peak enable comparator circuit 500 may be used to implement either of peak enable comparator circuits 405 and 415 discussed with regard to FIG. 4A. Peak enable comparator circuit 500 includes a peak detector circuit 505 that detects a peak in an envelope voltage received as an input voltage Vin at a transconductance amplifier 510. Transconductance amplifier 510 compares the envelope signal to a stored peak voltage (Vout(peak)) on a capacitor C. If the stored peak voltage is greater than the envelope voltage, transconductance amplifier 510 does not conduct any appreciable current. The output of transconductance amplifier 510 connects to a drain of a p-type metal-oxide semiconductor (PMOS) transistor P1 having a source connected to a power supply node for a power supply voltage VDD. With transconductance amplifier 510 not conducting, transistor P1 cannot conduct also so its drain voltage Vx charges to substantially equal the power supply voltage VDD.

Peak enable comparator circuit 500 also includes a comparator 515 that receives the drain voltage VX at an inverting input and receives a threshold voltage (e.g., VDD/2) at its non-inverting input. A peak enable pulse signal output from comparator 515 will thus be discharged while the drain voltage VX is high (greater than VDD/2). However, as the envelope voltage rises above the stored peak voltage, transconductance amplifier 510 begins to conduct current so that the drain voltage Vx begins to discharge. Transistor P1 is diode-connected (its drain being connected to its gate) and is in a current-mirror configuration with a PMOS transistor P2 (the gate of transistor P1 being connected to transistor P2, which has the same source voltage as transistor P1). Transistor P2 will thus conduct a mirrored current of a current that transistor P1 is conducting due to the discharge of the drain voltage Vx. A drain of transistor P2 couples to ground through capacitor C. The stored peak voltage will thus rise due to the mirrored current through transistor P2 to equal whatever peak value is experienced by the envelope voltage. To allow peak detector circuit 505 to detect additional peak values, capacitor C may be periodically discharged through another transistor (not illustrated). Alternatively, capacitor C may leak to ground through a resistor (not illustrated) so that the peak voltage may be renewed. When the drain voltage Vx goes low due to a new peak voltage charging the capacitor C, comparator 515 pulses its peak enable pulse output signal high. Referring again to FIG. 4C, an example of such pulsing high is given by the start pulse signal 403 and the stop pulse signal 404.

Figure 6:
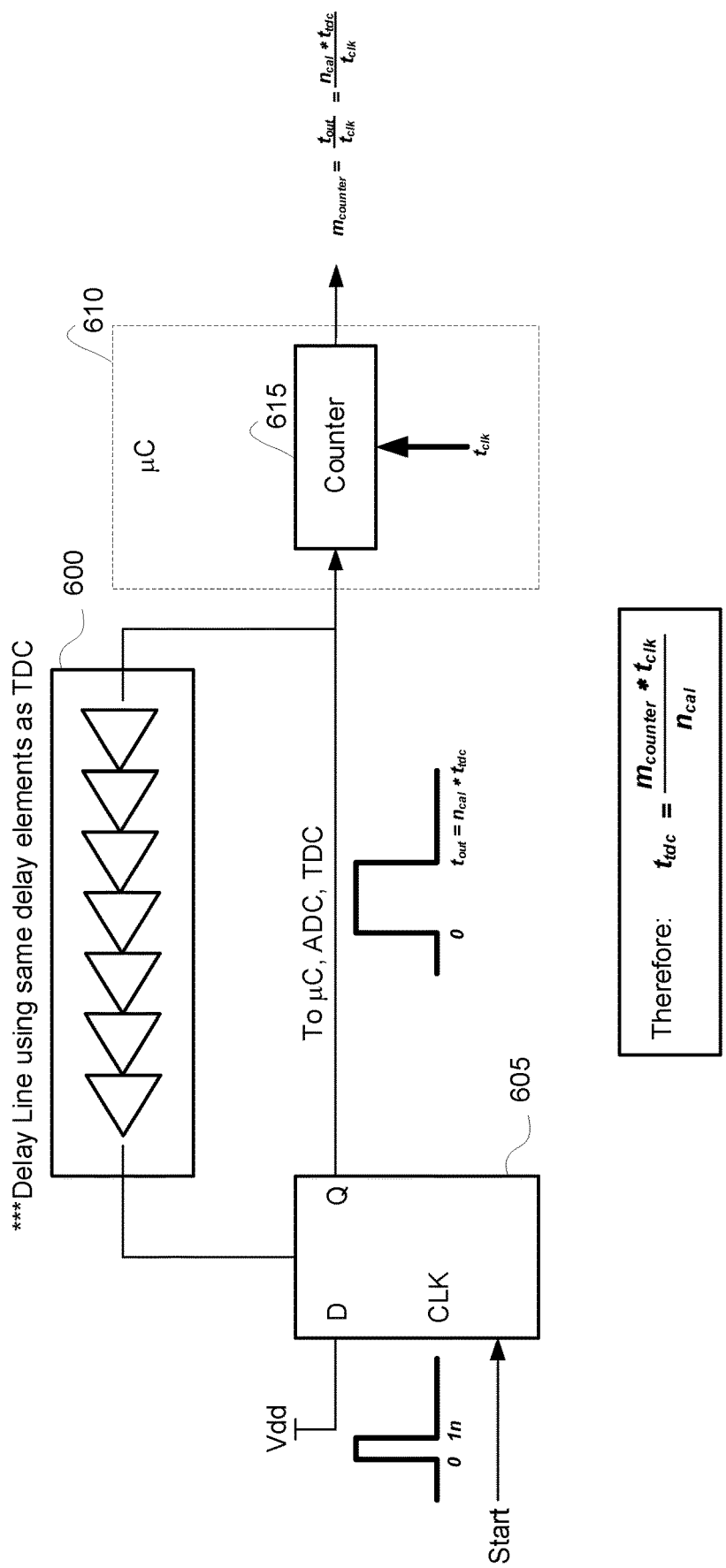
FIG. 6 illustrates a calibration circuit for a delay line in an in-situ delay measurement circuit in accordance with an aspect of the disclosure.

Note that the accuracy of TDC 410 depends upon semiconductor manufacturing process and temperature corners. The TDC time increment $t_{tdc}$ may change over time due to such variations. TDC 410 may thus be calibrated using a calibration delay line 600 as shown in FIG. 6. Calibration delay line 600 may have the same number n of delay elements as discussed with regard to delay line 440 in TDC 410. Alternatively, calibration delay line 600 may have a multiple of the number n of delay elements used in delay line 440 to increase the calibration resolution. To begin the calibration process, a flip-flop 605 is clocked. Flip-flop 605 receives the power supply voltage VDD at its data input D so that a Q output signal of flip-flop 605 is asserted high in response to a rising edge of the starting pulse to flip-flop 605.

The Q output signal of flip-flop 605 drives an input of calibration delay line 600. The Q output signal will then be delayed through calibration delay line 600 to drive a reset input of flip-flop 605. Each delay element in calibration delay line 600 provides a TDC increment of delay $t_{tdc}$. Since there are n of these delay elements in calibration delay line, flip-flop 605 will thus reset its Q output signal a pulse width $n*t_{tdc}$ after the rising edge of the start pulse for flip-flop 605. The assertion of the Q output signal enables a counter 615 to begin counting within a microprocessor 610 (e.g., a microprocessor within modem 205) responsive to cycles of a calibration clock signal $t_{clk}$. Counter 615 will thus count a count $m_{counter}$ of counts during the pulse width $n*t_{tdc}$ of the Q output signal, where $m_{counter}$ equals a ratio of $(n*t_{tdc})$ divided by $t_{clk}$. The TDC increment $t_{tdc}$ may then be calibrated responsive to the ratio of $(m_{counter}*t_{clk})$ divided by n.

Figure 7:
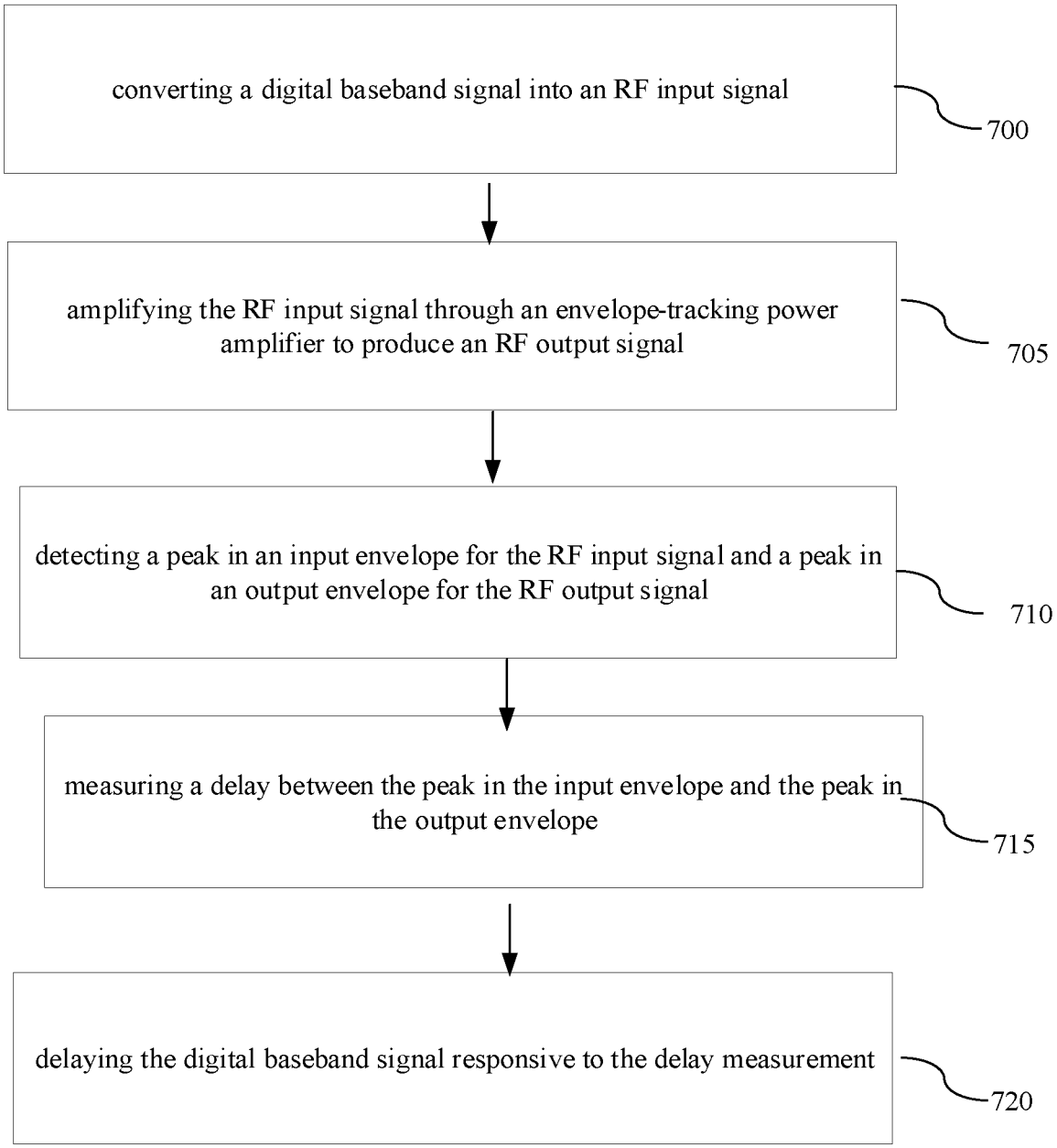
FIG. 7 is a flowchart for a method of performing an in-situ measurement of the RF-path-to-envelope-path delay for an envelope-tracking transmitter in accordance with an aspect of the disclosure.

A method of measuring the RF-path-to-envelope-path delay is shown in the flowchart of FIG. 7. The method includes an act 700 of converting a digital baseband signal into an RF input signal. The operation of I/Q DAC 110 and upconverter 116 in transmitter 200 and in transmitter 300 is an example of act 700. The method also includes an act 705 of amplifying the RF input signal through an envelope-tracking power amplifier to produce an RF output signal. The amplification by power amplifier 120 in transmitter 200 and in transmitter 300 is an example of act 705. In addition, the method includes an act 710 of detecting a peak in an input envelope for the RF input signal and a peak in an output envelope for the RF output signal. The operation by envelope detectors 225 and 235 in transmitter 200 is an example of act 710. The method also includes an act 715 of measuring a delay between the peak in the input envelope and the peak in the output envelope. The measurement of the input-to-output envelope delay by delay measurement circuit 230 in transmitter 200 is an example of act 715. Finally, the method includes an act of 720 of delaying the digital baseband signal responsive to the delay measurement. The delaying of the digital baseband signal by modem 205 in transmitter 200 is an example of act 720.

Figure 8:
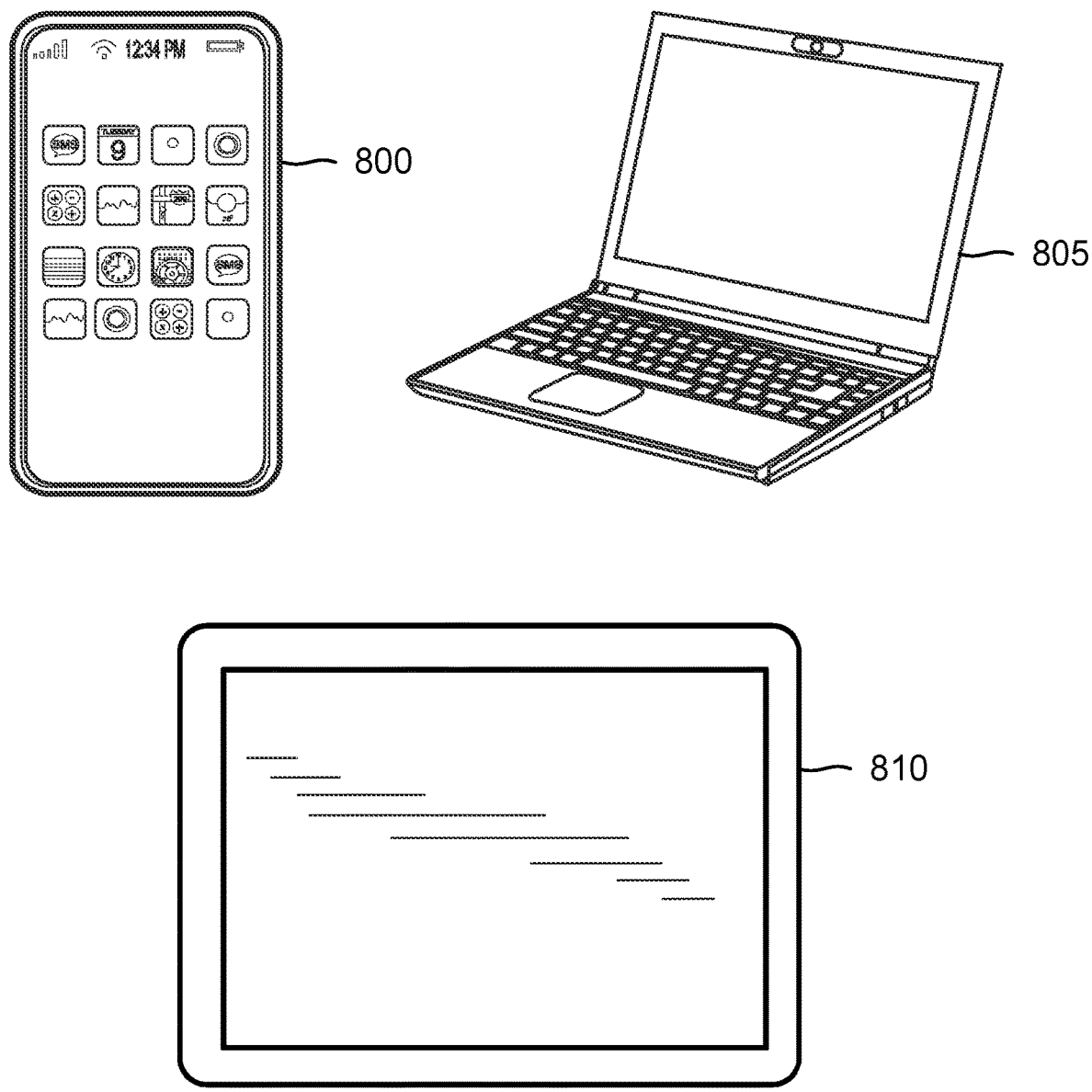
FIG. 8 illustrates some example mobile devices incorporating an envelope-tracking transmitter with an in-situ measurement of the RF-path-to-envelope-path delay in accordance with an aspect of the disclosure.

An envelope-tracking transmitter with a delay measurement circuit as disclosed herein may be advantageously incorporated into numerous applications. For example, as shown in FIG. 8, a cellular telephone 800, a laptop computer 805, and a tablet PC 810 may all include an envelope-tracking transmitter with a delay measurement circuit as disclosed herein.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A transmitter, comprising:
a power amplifier configured to amplify an RF input signal to form an RF output signal;
an envelope-tracking power supply configured to provide an envelope-tracking power supply voltage for the power amplifier; and
a delay measurement circuit configured to measure a delay between an input envelope of the RF input signal and an output envelope of the RF output signal to provide a measured delay.

2. The transmitter of claim 1, wherein the delay measurement circuit comprises:
an input peak detector circuit configured to detect a peak in the input envelope;
an output peak detector circuit configured to detect a peak in the output envelope; and
a time-to-digital converter configured to provide a digital word responsive to a delay between the peak in the input envelope and the peak in the output envelope, wherein the digital word represents the measured delay.

3. The transmitter of claim 2, wherein the time-to-digital converter comprises:
a delay line having a plurality of delay elements; and
a plurality of storage elements corresponding to the plurality of delay elements, the plurality of storage elements being configured to provide the digital word.

4. The transmitter of claim 3, wherein the time-to-digital converter includes a first comparator configured to pulse a first one of the delay elements in the delay line responsive to a detection by the input peak detector circuit of the peak in the input envelope.

5. The transmitter of claim 4, wherein the time-to-digital converter further includes a second comparator configured to trigger the plurality of storage elements to latch the digital word responsive to a detection by the output peak detector circuit of the peak in the output envelope.

6. The transmitter of claim 3, wherein plurality of storage elements comprises a plurality of flip-flops.

7. The transmitter of claim 2, further comprising:
a modem including a baseband digital-to-analog converter configured to convert a digital baseband signal into an analog baseband signal; and
an upconverter configured to frequency convert the analog baseband signal into the RF input signal.

8. The transmitter of claim 7, wherein the modem is configured to delay the digital baseband signal responsive to the measured delay.

9. The transmitter of claim 1, wherein the transmitter is incorporated into a cellular telephone.

10. A transmitter, comprising:
a power amplifier configured to amplify an RF input signal to form an RF output signal;
an envelope-tracking power supply configured to provide an envelope-tracking power supply voltage for the power amplifier; and
a delay measurement circuit configured to measure a delay between an input envelope of the RF input signal and the envelope-tracking power supply voltage to provide a measured delay.

11. The transmitter of claim 10, wherein the delay measurement circuit comprises:
an input peak detector circuit configured to detect a peak in the input envelope;
an output peak detector circuit configured to detect a peak in the envelope-tracking power supply voltage; and
a time-to-digital converter configured to provide a digital word responsive to a delay between the peak in the input envelope and the peak in the envelope-tracking power supply voltage, wherein the digital word represents the measured delay.

12. The transmitter of claim 11, wherein the time-to-digital converter comprises:
a time-to-digital delay line having a plurality of delay elements; and
a plurality of storage elements corresponding to the plurality of delay elements, the plurality of storage elements being configured to provide the digital word.

13. The transmitter of claim 12, wherein the time-to-digital converter includes a first comparator configured to pulse a first one of the delay elements in the time-to-digital delay line responsive to a detection by the input peak detector circuit of the peak in the input envelope.

14. The transmitter of claim 13, wherein the time-to-digital converter further includes a second comparator configured to trigger the plurality of storage elements to latch the digital word responsive to a detection by the output peak detector circuit of the peak in the envelope-tracking power supply voltage.

15. The transmitter of claim 12, wherein plurality of storage elements comprises a plurality of flip-flops.

16. The transmitter of claim 11, further comprising:
   a modem including a baseband digital-to-analog converter configured to convert a digital baseband signal into an analog baseband signal; and
   an upconverter configured to frequency convert the analog baseband signal into the RF input signal.

17. The transmitter of claim 16, wherein the modem is configured to delay the digital baseband signal responsive to the measured delay.

18. The transmitter of claim 12, further comprising:
   a calibration delay line having a plurality of calibration delay elements; and
   a counter configured to count during a delay period for a pulse to propagate through the calibration delay line to provide a calibration count, wherein the transmitter is configured to calibrate the time-to-digital delay line responsive to the calibration count.

19. A method, comprising:
   converting a digital baseband signal into an RF input signal;
   amplifying the RF input signal through an envelope-tracking power amplifier to produce an RF output signal;
   detecting a peak in an input envelope of the RF input signal and a peak in an output envelope of the RF output signal;
   measuring a delay between the peak in the input envelope and the peak in the output envelope; and
   delaying the digital baseband signal responsive to the delay measurement.

20. The method of claim 19, wherein measuring the delay between the peak in the input envelope and the peak in the output envelope comprising pulsing an input of a time-to-digital delay line having a plurality of delay elements responsive to the detection of the peak in the input envelope.

21. The method of claim 20, wherein an output of each delay element in the time-to-digital delay line drives a corresponding storage element in a plurality of storage elements and wherein measuring the delay between the peak in the input envelope and the peak in the output envelope further comprises triggering the plurality of storage elements to latch responsive to the detection of the peak in the output envelope.

22. The method of claim 20, further comprising calibrating the time-to-digital delay line by:
   propagating a pulse through a calibration delay line;
   counting responsive to cycles of a clock signal while the pulse propagates through the calibration delay line to form a calibration count; and
   calibrating the time-to-digital delay line responsive to the calibration count.

23. A method, comprising:
   converting a digital baseband signal into an RF input signal;
   generating an envelope-tracking power supply voltage responsive to a magnitude of the digital baseband signal;
   amplifying the RF input signal through an envelope-tracking power amplifier to produce an RF output signal while the envelope-tracking power amplifier is powered by the envelope-tracking power supply voltage;
   detecting a peak in an input envelope of the RF input signal and a peak in the envelope-tracking power supply voltage;
   measuring a delay between the peak in the input envelope and the peak in the envelope-tracking power supply voltage; and
   delaying the digital baseband signal responsive to the delay measurement.

24. The method of claim 23, wherein measuring the delay between the peak in the input envelope and the peak in the envelope-tracking power supply voltage comprises pulsing an input of a time-to-digital delay line having a plurality of delay elements responsive to the detection of the peak in the input envelope.

25. The method of claim 24, wherein an output of each delay element in the time-to-digital delay line drives a corresponding storage element in a plurality of storage elements and wherein measuring the delay between the peak in the input envelope and the peak in the envelope-tracking power supply voltage further comprises triggering the plurality of storage elements to latch a digital word responsive to the detection of the peak in the envelope-tracking power supply voltage, wherein the digital word forms the delay measurement.

26. The method of claim 23, further comprising calibrating the time-to-digital delay line by:
   propagating a pulse through a calibration delay line;
   counting responsive to cycles of a clock signal while the pulse propagates through the calibration delay line to form a calibration count; and
   calibrating the time-to-digital delay line responsive to the calibration count.

* * * * *